United States Patent
Mangum et al.

(10) Patent No.: US 6,744,285 B2
(45) Date of Patent: Jun. 1, 2004

(54) METHOD AND APPARATUS FOR SYNCHRONOUSLY TRANSFERRING DATA ACROSS MULTIPLE CLOCK DOMAINS

(75) Inventors: Wayne G. Mangum, Ft. Collins, CO (US); Brian C. Miller, Ft. Collins, CO (US); Peter J. Meier, Ft. Collins, CO (US); Cory Groth, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/215,157

(22) Filed: Aug. 8, 2002

(65) Prior Publication Data

US 2004/0027166 A1 Feb. 12, 2004

(51) Int. Cl.⁷ .................................... H03K 9/06
(52) U.S. Cl. ...................... 326/96; 326/97; 327/156; 327/172; 375/371
(58) Field of Search ............. 326/96, 97; 327/170–172, 327/248, 361; 375/371, 373, 376, 375

(56) References Cited

U.S. PATENT DOCUMENTS

| 4,868,513 | A | * | 9/1989 | Piercy et al. ................ 327/156 |
| 6,219,395 | B1 | * | 4/2001 | Pollack et al. .............. 375/371 |
| 6,437,620 | B1 | * | 8/2002 | Singor ........................ 327/172 |

FOREIGN PATENT DOCUMENTS

| JP | 02-220102 | 9/1990 |
| JP | 07-146642 | 6/1995 |

* cited by examiner

Primary Examiner—Vibol Tan

(57) ABSTRACT

A method and an apparatus for aligning the phases of clocks of different clock domains of an IC to enable data to be transferred synchronously across the clock domains. The present invention comprises a phase-alignment system that is adjustable via a user interface to enable the clock phases to be adjusted. A user controls the degree of alignment of the phases via the user interface. The present invention enables the phases of clocks of different clock domains to be adjusted even after the IC has been fabricated.

14 Claims, 5 Drawing Sheets

METHOD AND APPARATUS FOR SYNCHRONOUSLY TRANSFERRING DATA ACROSS MULTIPLE CLOCK DOMAINS

TECHNICAL FIELD OF THE INVENTION

The present invention relates generally to electrical circuits and, more particularly, to a method and an apparatus for aligning the phases of clocks of different clock domains to enable data to be transferred synchronously across the clock domains.

BACKGROUND OF THE INVENTION

It is common for integrated circuit (IC) technology to have multiple clock domains. In each clock domain, the domain logic is driven by a clock operating at a particular frequency that is different from the clock frequency of the clocks of the other clock domains. When data is transferred between clock domains, the transfer of data must be synchronized between the clock domains so that data will not be lost, so that setup and hold time violations will not occur in the downstream logic and so that the synchronization of data between clock domains will occur with maximum throughput. In order for these goals to be accomplished, many different clock domain synchronization techniques and designs have been developed.

These various synchronization solutions generally fall into two categories. The first and simplest solution is to place synchronizing flip flops at the location where transferred data is received at the receiving clock domain, as shown in FIG. 1. FIG. 1 illustrates logic 1 of clock domain A being controlled by clock A and logic 2 of clock domain B being controlled by clock B. Clocks A and B have different clock rates. Data sent from clock domain A to clock domain B must be synchronized to clock B and data sent from clock domain B to clock domain A must be synchronized to clock domain A. Otherwise, data transferred between clock domains A and B may be lost and/or erroneous results may occur due to setup and/or hold time violations. Data output from logic 1 is output at the rate of clock A, as indicated by line 3 and must be converted into data at clock B. Data output from logic 2 is output at the rate of clock B, as indicated by line 4. The data being sent from logic 1 to logic 2 is received by flip flop 5, which is controlled by clock B, as indicated. The data being sent from logic 2 to logic 1 is received by flip flop 6, which is controlled by clock A, as indicated.

When clock B is high, data at the D input of flip flop 5 (i.e., data being transferred from logic 1 to logic 2) is output from the Q output of flip flop 5 at the clock rate of clock B so that the data is synchronized to the logic 2 of clock domain B. Similarly, when clock A is high, data at the D input of flip flop 6 is output from the Q output of flip flop 6 (i.e., data being transferred from logic 2 to logic 1) at the clock rate of clock A so that is synchronized with the logic 1 of clock domain A.

Solutions of the type shown in FIG. 1 may not be adequate due to additional delays of the data signals and uncertainty as to when the data will arrive during a clock cycle. The second solution does not utilize the flip flop synchronizer circuit of FIG. 1, but rather, ensures that the data crosses the clock domains synchronously by controlling the clock skews between the clock domains. This solution, which is represented in FIG. 2 by the transfer of data between clock domain 10, which is being driven by clock A, and clock domain 11, which is being driven by clock B. The solution represented by FIG. 2 is more difficult to implement than that of FIG. 1 and depends on the clock frequencies and how they align with each other. In the past, in order to implement this solution, the designer would simulate the clock alignment as precisely as possible before releasing the design for fabrication. For example, a 5:4 ratio of the rates of clocks A and B would mean that the rising edges of both clocks align at the beginning of every fifth cycle of clock A and every fourth cycle of clock B. The IC designer would design the clock circuits so that the rising edges that occur on the fifth and fourth clock cycles of clocks A and B, respectively, are as precisely aligned as possible given the other design considerations of the IC.

The problem with the solution represented by FIG. 2 is that, if a determination is made that the timing of the IC is off, no "quick fix" is available to check the alignment of the clocks to determine if the timing problem is due to misalignment of the clocks. Rather, schematic-based simulations must be performed to correct the alignment of the clock domains. Furthermore, if timing problems occur after fabrication of the IC, there is no way to correct the phase alignment of the clocks of the IC.

Accordingly, a need exists for a method and apparatus that enable precise data transfer across different clock domains and that enable the alignment of the phases of the clocks to be corrected after the IC has been fabricated.

SUMMARY OF THE INVENTION

The present invention provides a method and an apparatus for aligning the phases of clocks of different clock domains of an IC to enable data to be transferred synchronously across the clock domains. The present invention comprises a phase-alignment system that is adjustable via a user interface to enable the clock phases to be adjusted. A user controls the degree of alignment of the phases via the user interface. The present invention enables the phases of clocks of different clock domains to be adjusted even after the IC has been fabricated, the apparatus including phase-alignment logic which is configured to receive input from the user interface. The input automatically configures the phase-alignment logic to cause the phase of at least one of the first and second clocks to be adjusted, thereby adjusting the degree of alignment of the phases of the first and second clocks.

The method of the present invention is directed to adjusting a degree of alignment of clock phases of a first clock driving logic of a first clock domain of an integrated circuit (IC) and a second clock driving logic of a second clock domain of the IC. The method comprises the steps of receiving input from a user interface in phase-alignment logic of the IC and then automatically configuring the phase-alignment logic in accordance with the input to delay at least one of the first and second clocks in time, thereby adjusting the degree of alignment of the phases of the first and second clocks.

These and other features and advantages of the present invention will become apparent from the following description, drawings and claims.

DETAILED DESCRIPTION OF THE PREFERRED EMBODIMENT

The present invention provides a phase-alignment system that allows the alignment of the clock domains to be changed after the IC has been fabricated. Real data can be used to check the alignment of the clock phases as opposed to using schematic simulations. In accordance with the present invention, the IC includes a user interface by which the phase alignment of the clocks can be adjusted to correct timing problems in the IC. Furthermore, not only can the phase alignment of the clocks of the IC be corrected by a user via the user interface, thus obviating the need to perform the fabrication process again, but the present invention enables the designer to obtain better data about the existing timing margins for the clock domain crossing than the data that could be obtained by performing schematic simulations.

Figure 1:
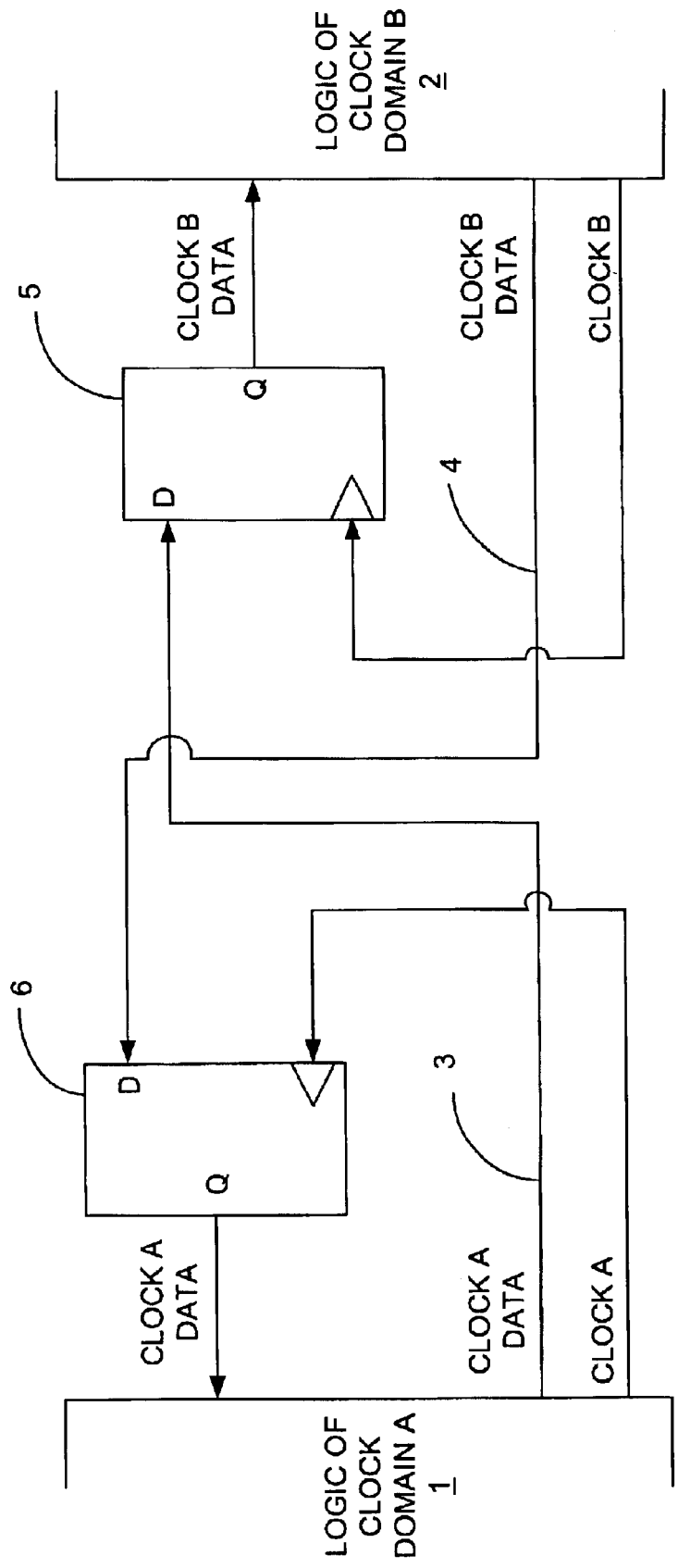
FIG. 1 is a block diagram illustrating a known synchronizer circuit for synchronizing the transfer of data between two clock domains.
Figure 2:
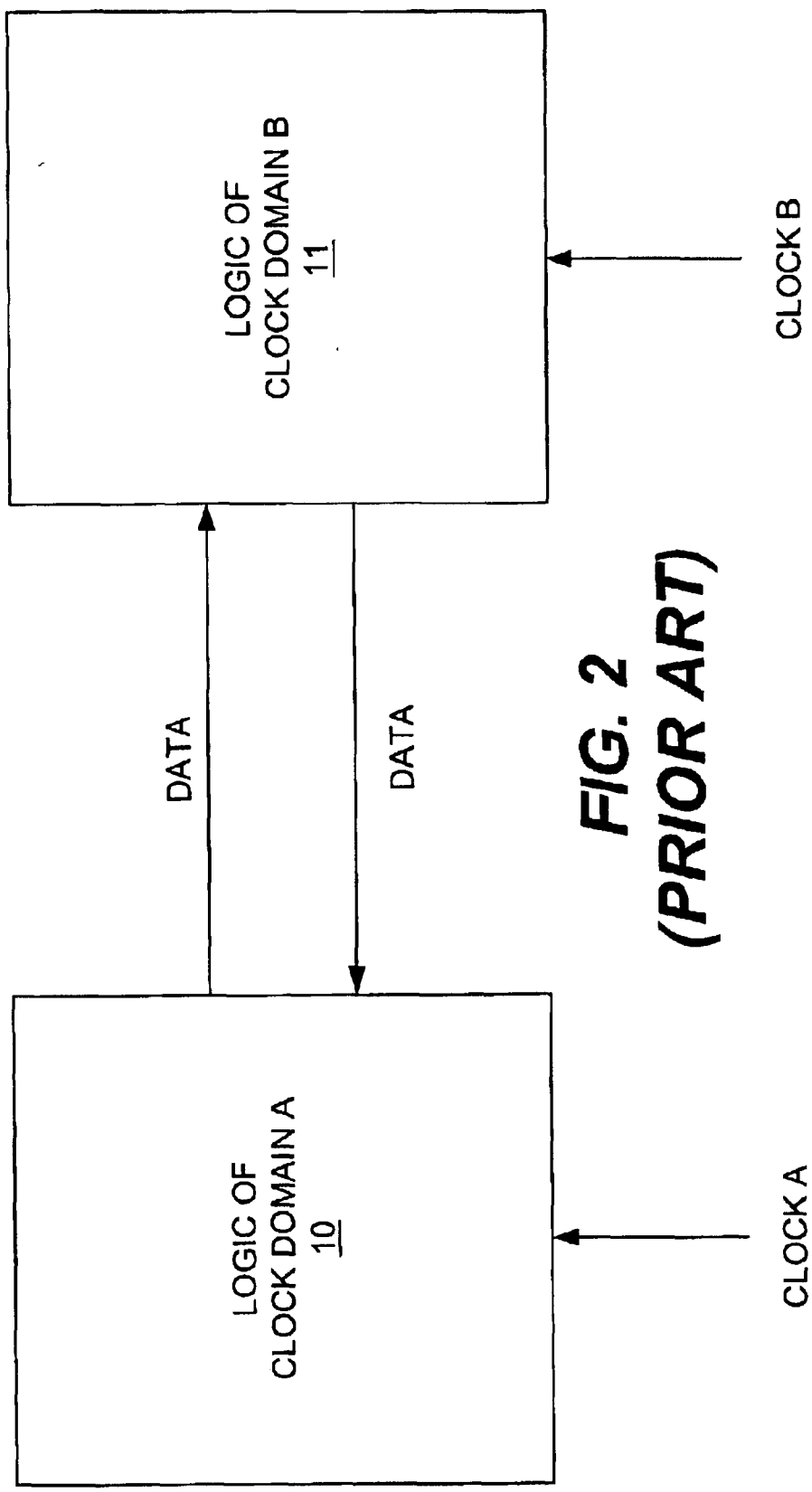
FIG. 2 is a block diagram illustrating a known technique for transferring data between two clock domains that relies on phase-alignment of the clocks.
Figure 3:
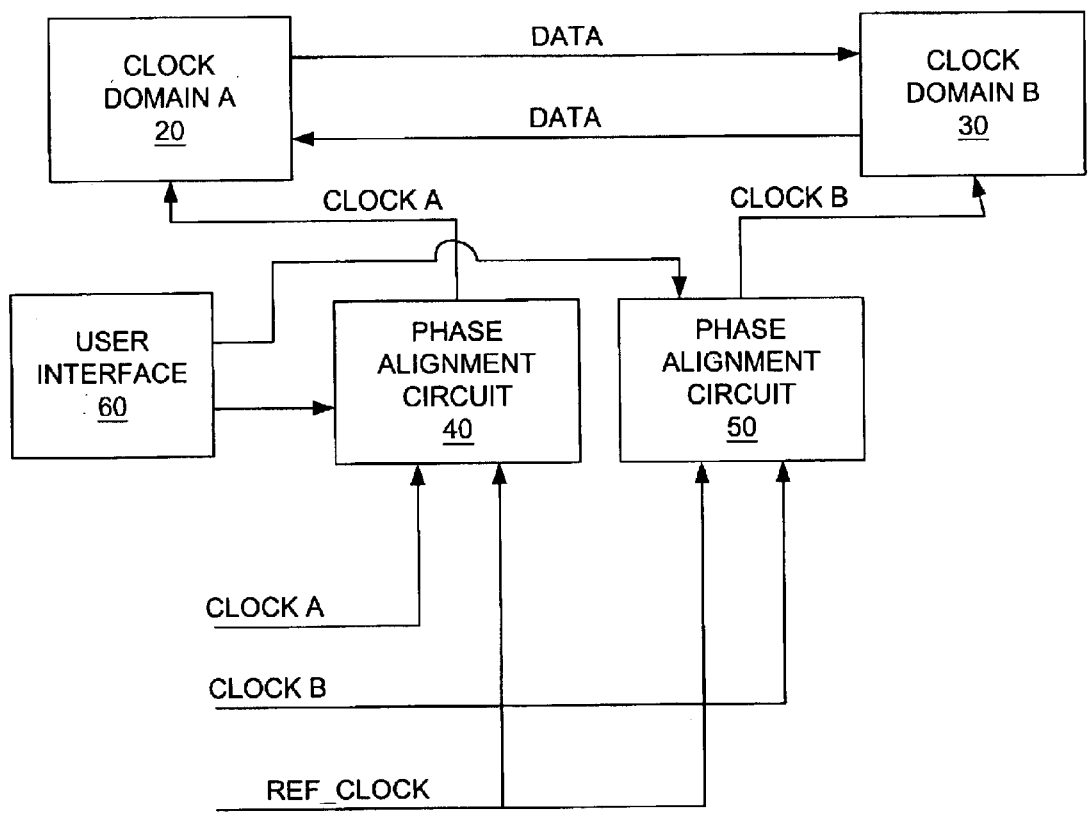
FIG. 3 is a block diagram of the preferred embodiment of the phase-alignment system of the present invention for synchronizing the transfer of between multiple clock domains, which includes a user interface that enables a user to adjust the phase alignment of the clocks.

FIG. 3 is a block diagram that illustrates the phase-alignment system of the present invention in accordance with the preferred embodiment. The phase-alignment system enables data to cross from clock domain A 20 to clock domain B 30, and vice versa, synchronously by controlling the clock skews of clocks A and B. The phase-alignment system comprises a phase-alignment circuit 40 that controls the phase of clock A and a comprises a phase-alignment circuit 50 that controls the phase of clock B. Clock A drives the logic of clock domain A 20 and clock B drives the logic of clock domain B 30. A reference clock, "REF_CLOCK", is delivered to both of the phase-alignment circuits 40 and 50 so that clocks A and B can be compared to the same reference clock in order to determine the difference between the phases and whether or not either or both of the clock phases need to be adjusted.

The phase-alignment system also comprises a user interface 60 that provides a user with a mechanism by which the phase-alignment circuits 40 and 50 can be controlled. As described below in detail with reference to FIG. 4, each of the phase-alignment circuits 40 and 50 comprises delay elements that have known delay times. The phases of clocks A and B can be varied by adjusting the number of delay elements in the paths of clocks A and B or by adjusting the number of delay elements in the path of the reference clock. The placement of the delay elements in the clock paths is controlled by the user through the user interface.

Figure 4:
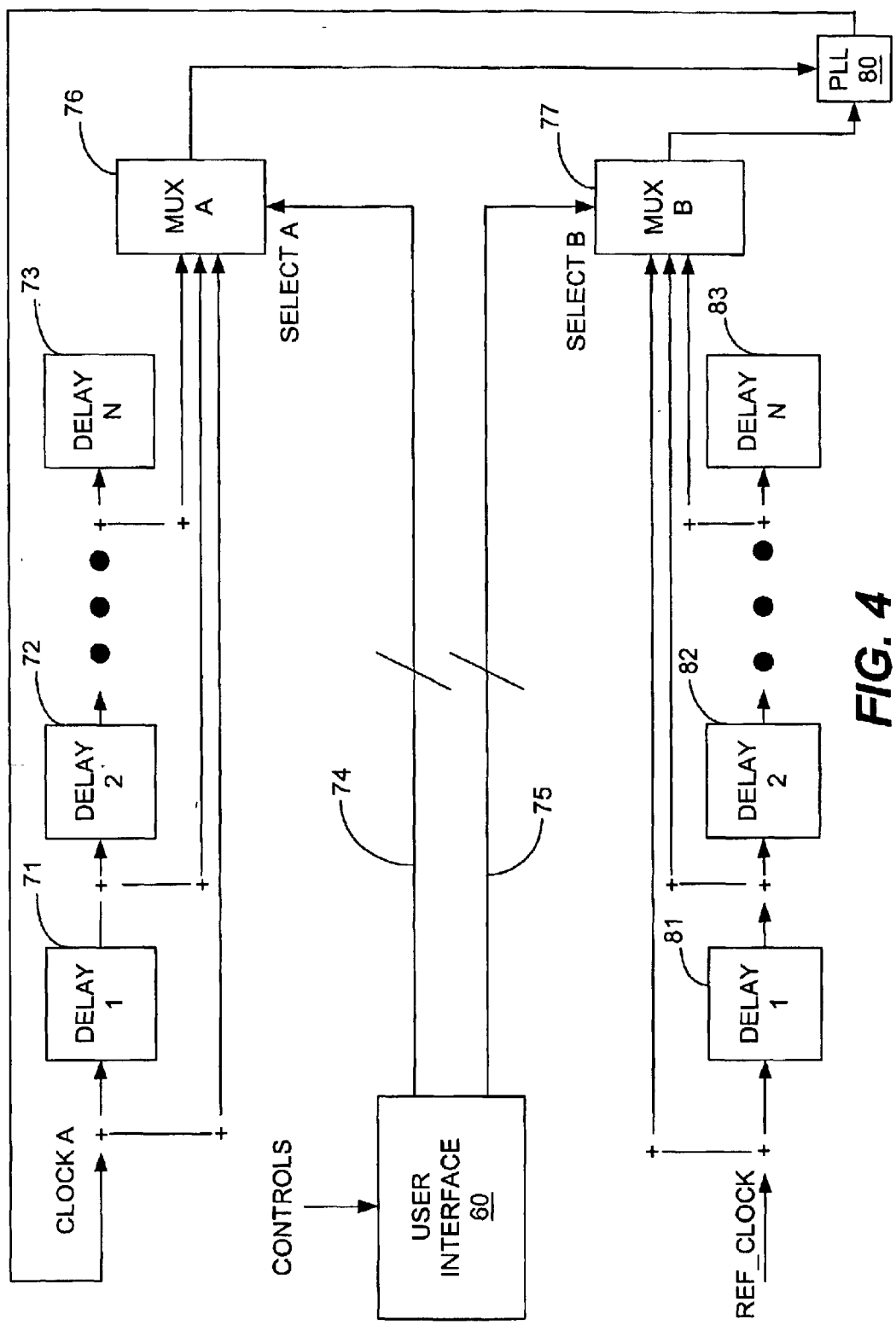
FIG. 4 is a block diagram of one of the phase-alignment circuits of the phase-alignment system shown in FIG. 3.

FIG. 4 is a block diagram of the phase-alignment circuit 40 of FIG. 3. The phase-alignment circuit 50 of FIG. 3 is identical to phase-alignment circuit 40. Therefore, in the interest of brevity, only the operations and components of the phase-alignment circuit 40 will be described herein. The N delay elements that can be selectively placed in the path of clock A are referenced by numerals 71, 72 and 73. The N delay elements that can be selectively placed in the path of the reference clock are referenced by numerals 81, 82 and 83. Preferably, the delay elements have equal delay times, although this is not necessary. Also, the number of delay elements comprised by the phase-alignment circuit is not limited to any particular number. Also, preferably the number of delay elements that can be placed in the path of clock A and the path of the reference clock are equal, although this is not a requirement.

The number of delay elements that are placed in the clock paths is controlled by the select lines 74, "SELECT_A_DELAY", and 75, "SELECT_REF_DELAY", which are controlled by the user via the user interface 60. The select lines 74 and 75 are each multi-bit lines that are received by multiplexers A 76 and B 77. The number of delay elements that are connected in series with the clock lines depends on the bit values that are delivered to the multiplexers 76 and 77. The outputs of the multiplexers 76 and 77 are received by the PLL 80, the output of which corresponds to clock A.

When ether no delay elements are placed in the paths of the reference clock and clock A or the same number of delay elements are placed in both paths, the phase of clock A will not change. However, when the reference clock is delayed more than clock A, the PLL 80 will cause clock A to be shifted back in phase. When clock A is delayed more than the reference clock, the PLL 80 will cause clock A to be shifted back in phase. Therefore, the phase of clock A can be adjusted by the user through the user interface 60 by the user causing particular bit values to be sent to the multiplexers 76 and 77, thereby causing the multiplexers 76 and 77 to select the appropriate number of delay elements to be placed in series with the clocks.

One way to determine whether the phases of either of clocks A and B need to be adjusted is to place input bit patterns into the combinational logic of the IC and analyze the output produced by the IC. If errors in the output of the IC exist, a determination can be made that the IC has a timing problem. Once this determination is made, the phase of one or both of the clocks connected to the user interface can be adjusted to align the phases. Once the errors in the output of the IC cease to exist, a determination is made that the phases are aligned.

Another feature of the alignment system of the present invention is that it enables the clock skew margin to be determined and adjusted if necessary or desired. The clock skew is the difference in time between when the clock edges trigger events in the respective clock domain. The clock skew margin relates to the amount by which the clocks can be skewed without causing setup and/or hold time violations to occur in the logic that is in the paths of the data signals being transferred across the clock domains. Any increase in the clock skew margin translate into a lesser likelihood that setup and/or hold times will occur. Increases in clock skew margin also enable the amount of logic that is placed in the data path to be increased.

The manner in which the clock skew can be determined and the manner in which the clock skew margin can be adjusted will now be described in accordance with an example. With reference again to FIG. 4, because each delay element 71–73 and 81–83 has a known, predefined delay associated with it, the amount of skew between clock A and the reference clock can be determined by first aligning clock A with the reference clock and then by adding one or more delay elements in the path of the reference clock. The total time delay of the combined delay elements equals the skew between clock A and the reference clock. If clock B is aligned with the reference clock (i.e., none or the same number of delay elements in each path), then the clock skew between clocks A and B is equal to the clock skew between clock A and the reference clock.

The maximum skew margin can be determined by adding one or more delay elements to the reference clock path (FIG. 4) and analyzing the IC output to determine the point in time at which errors in the output of the IC begin to occur. Clock B is maintained in alignment with the reference clock. The delay time associated with the combination of delay elements in the reference clock path of the phase-alignment circuit 40 (FIG. 3) just before errors began to be detected corresponds to the maximum skew margin for clocks A and B. As stated above, by maximizing this margin, the possibility of setup and/or hold times occurring is decreased.

Figure 5:
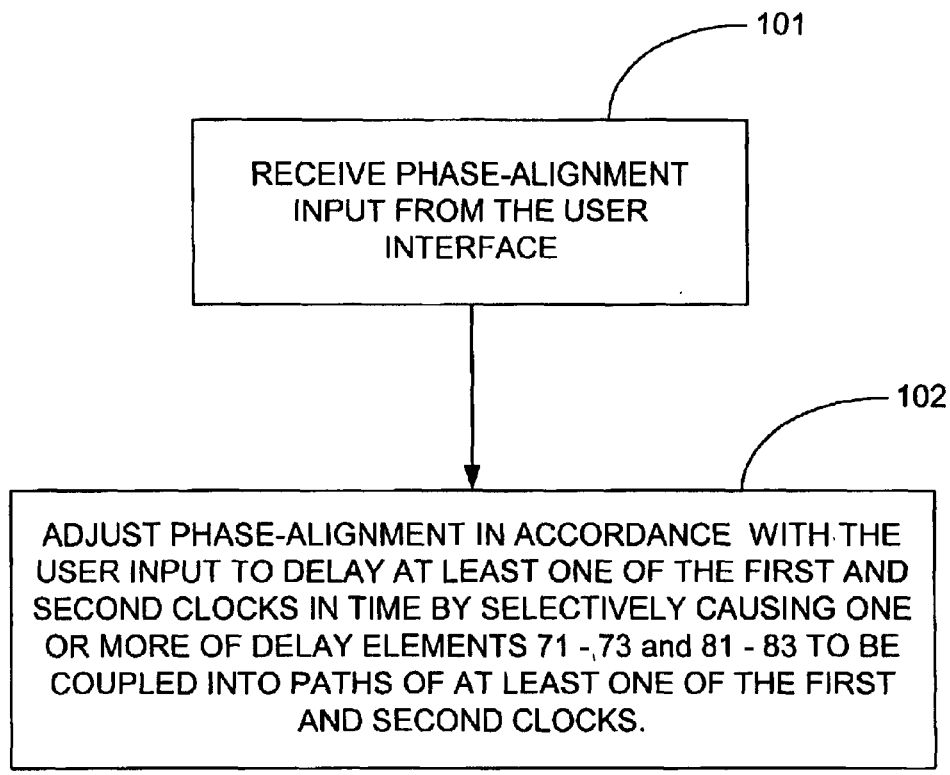
FIG. 5 is a flow chart demonstrating the method of the present invention in accordance with an embodiment for adjusting the degree of alignment of clock phases of a first clock driving logic of a first clock domain of an IC and a second clock driving logic of a second clock domain of the IC.

FIG. 5 is a flow chart demonstrating the method of the present invention in accordance with an embodiment for adjusting the degree of alignment of clock phases of a first clock driving logic of a first clock domain of an IC and a second clock driving logic of a second clock domain of the IC. First, input is received from a user interface in one of the phase-alignment circuits 40 and/or 50 (FIG. 3), as indicated by block 101. The phase-alignment circuit 40 and/or 50 that receives the input then automatically configures the phase-alignment system of FIG. 3 in accordance with the received input to delay at least one of the first and second clocks in time, thereby adjusting a degree of alignment of the phases of the first and second clocks. This step is represented by block 102.

During step 102, the input from the user interface 60 automatically configures the phase-alignment system to delay at least one of the first and second clocks in time by selectively causing one or more delay elements 71–73 and 81–83 (FIG. 4) of the phase alignment system to be coupled into paths of at least one of the first and second clocks. As stated above, each of the delay elements has a known time delay associated with it.

It should be noted that the present invention has been described with reference to example and preferred embodiments. However, those skilled in the art will understand that modifications can be made to the embodiments discussed herein that are within the scope of the present invention. For example, the present invention is not limited with respect to the manner in which the user interface is implemented. Preferably, the user interface is connected to an IC test access port (TAP), which interfaces with the multipexers of the phase-alignment circuits. However, the user interface could be connected to any suitable location on the IC. Also, there are many ways in which delay times of known duration can be implemented on an IC and selectively placed in a clock signal path. One way is to use a buffer for each delay element since buffers have known delay times associated with them. It should also be noted that the there are multiple ways in which the phase-alignment circuits can be implemented and that the configuration shown in FIG. 4 is only an example of one particular embodiment of a circuit that is suitable for this purpose. Those skilled in the art will understand that modifications can be made to the embodiment discussed herein and that all such modifications are within the scope of the present invention.

What is claimed is:

1. An apparatus for adjusting a degree of alignment of clock phases of a first clock driving logic of a first clock domain of an integrated circuit (IC) and a second clock driving logic of a second clock domain of the IC, the apparatus comprising:

phase-alignment logic, the phase-alignment logic being configured to receive input from a user interface, the input automatically configuring the phase-alignment logic to delay the phase of at least one of the first and second clocks to adjust the degree of alignment of the phases of the first and second clocks, wherein said input configures the phase-alignment logic to cause at least one of the first and second clocks to be delayed in time, thereby causing the degree of alignment of the phases of the first and second clocks to be adjusted.

2. The apparatus of claim 1, wherein said input configures the phase-alignment logic to cause at least one of the first and second clocks to be delayed in time by selectively coupling one or more delay elements into paths of at least one of the first and second clock, each of said one or more delay elements having a known time delay associated therewith.

3. The apparatus of claim 1, wherein the phase-alignment logic comprises:

a first phase-alignment circuit, the first phase-alignment circuit receiving the first clock and a reference clock, the reference clock having a phase, the first phase-alignment circuit comprising first controllable time delay logic for delaying at least one of the first clock and the reference clock by a known, selectable time delay; and a second phase-alignment circuit, the second phase alignment circuit receiving the second clock and said reference clock, the second phase-alignment circuit comprising second controllable time delay logic for delaying at least one of the second clock and the reference clock by a known, selectable time delay, wherein the degree of alignment of the phases of the first and second clock is adjusted by varying the phase relationship between of one of the first and second clocks and the reference clock.

4. The apparatus of claim 3, further comprising:

a user interface coupled to the first and second phase-alignment circuits, the user interface having an input device that a user can manipulate to control the phase relationship between of one of the first and second clocks and the reference clock.

5. The apparatus of claim 4, wherein when the user manipulates the input device, electrical signals are generated by the user interface and output to the first and second phase-alignment circuits, the electrical signals being received by at least one of the first and second controllable time delay logic and causing at least one of the first and second controllable time delay logic to delay at least one of the first clock, the second clock and the reference clock by said known, selectable time delay, wherein the degree by which said alignment of the phases of the first and second clock is adjusted depends on the values of said electrical signals.

6. The apparatus of claim 5, wherein the first and second controllable time delay logic each comprise first and second sets, respectively, of time delay elements having a known delay time associated therewith, each set of time delay elements comprising N delay elements, the first set of time delay elements of said first controllable time delay logic being associated with a path of the first clock, the second set of time delay elements of said first controllable time delay logic being associated with a path of the reference clock of the first phase-alignment circuit, the first set of time delay elements of said second controllable time delay logic being associated with a path of the second clock, the second set of time delay elements of said second controllable time delay logic being associated with a path of the reference clock of the second phase-alignment circuit, and wherein each of said delay elements is separately selectable according to said electrical signals, wherein when one of said delay elements is selected, the selected delay element is coupled into the path of the clock with which the selected delay element is associated thereby delaying the associated clock by the delay time associated with the selected delay element.

7. The apparatus of claim 6, wherein one or more of the delay elements of any of the sets of delay elements can be simultaneously selected and thereby coupled into the path of the clock with which the selected delay elements are associated, and wherein a total time delay in the associated clock is at least substantially equal to a sum of the delay times of the delay elements coupled into the path.

8. The apparatus of claim 7, wherein the phases of the first and second clocks are aligned when the phase of the first clock is aligned with the phase of the reference clock and the phase of the second clock is aligned with the phase of the reference clock.

9. The apparatus of claim 8, wherein an amount of clock skew between the first clock and the second clock is adjustable by aligning the phases of the second clock and the reference clock and by offsetting the phase relationship between the first clock and the reference clock by coupling one or more delay elements of the set of delay elements associated with the reference clock into the path of the reference clock.

10. The apparatus of claim 8, wherein an amount of clock skew between the first clock and the second clock is adjustable by aligning the phases of the second clock and the reference clock and by offsetting the phase relationship between the first clock and the reference clock by coupling one or more delay elements of the set of delay elements associated with the first clock into the path of the first clock.

11. The apparatus of claim 8, wherein a maximum clock skew margin associated with the first and second clocks is calculated by aligning the first and second clocks with the reference clock and then by increasing the delay of the reference clock by selectively coupling delay elements associated with the reference clock into the path of the reference clock until errors begin being detected in data signals output from the IC, wherein the maximum clock skew margin is equal to a sum of the time delays of the delay elements that were coupled into the path of the reference clock just before the errors began being detected in the data output from the IC.

12. The apparatus of claim 8, wherein a maximum clock skew margin associated with the first and second clocks is calculated by aligning the first and second clocks with the reference clock and then by increasing the delay of the first clock by selectively coupling delay elements associated with the first clock into the path of the first clock until errors begin being detected in data signals output from the IC, wherein the maximum clock skew margin is equal to a sum of the time delays of the delay elements that were coupled into the path of the first clock just before the errors began being detected in the data output from the IC.

13. A method for adjusting a degree of alignment of clock phases of a first clock driving logic of a first clock domain of an integrated circuit (IC) and a second clock driving logic of a second clock domain of the IC, the method comprising:

receiving input from a user interface in phase-alignment logic of the IC;

automatically configuring the phase-alignment logic in accordance with said input to delay at least one of the first and second clocks in time thereby adjusting a degree of alignment of the phases of the first and second clocks, wherein said input configures the phase-alignment logic to cause at least one of the first and second clocks to be delayed in time, thereby causing the degree of alignment of the phases of the first and second clocks to be adjusted.

14. The apparatus of claim 13, wherein the step of automatically configuring comprises the steps of:

receiving the first clock and a reference clock in a first phase-alignment circuit of the phase alignment logic, the reference clock having a phase, the first phase-alignment circuit comprising first controllable time delay logic for delaying at least one of the first clock and the reference clock by a known, selectable time delay; and receiving the second clock and said reference clock in a second phase-alignment circuit of the phase alignment logic, the second phase-alignment circuit comprising second controllable time delay logic for delaying at least one of the second clock and the reference clock by a known, selectable time delay; and adjusting the degree of alignment of the phases of the first and second clocks by varying the phase relationship between at least one of the first and second clocks and the reference clock.

\* \* \* \* \*